US005538915A

United States Patent [19]
Fu

[11] Patent Number: 5,538,915
[45] Date of Patent: Jul. 23, 1996

[54] PROCESS FOR FORMING SYNAPSES IN NEURAL NETWORKS AND RESISTOR THEREFOR

[75] Inventor: Chi Y. Fu, San Francisco, Calif.

[73] Assignee: The Regents of the University of California, Oakland, Calif.

[21] Appl. No.: 894,391

[22] Filed: Jun. 5, 1992

[51] Int. Cl.$^6$ ............................................. H01L 21/205
[52] U.S. Cl. ..................... 437/60; 437/101; 437/173; 437/918
[58] Field of Search ....................... 437/918, 192, 437/173, 190, 200, 101, 103, 109, 60

[56] References Cited

U.S. PATENT DOCUMENTS

| | | | |
|---|---|---|---|
| 3,699,964 | 10/1972 | McWilliams | 69/610 |
| 4,210,996 | 7/1980 | Amemiya | 29/610 |
| 4,268,950 | 5/1981 | Chatterjee | 29/571 |
| 4,285,117 | 8/1981 | Heeren | 29/571 |
| 4,329,774 | 5/1982 | Calligaro | 29/583 |
| 4,643,777 | 2/1987 | Maeda | 148/1.5 |
| 4,752,906 | 6/1988 | Kleinfeld | 364/807 |
| 4,762,801 | 8/1988 | Kapoor | 437/24 |
| 4,782,320 | 11/1988 | Shier | 338/295 |
| 4,782,460 | 11/1988 | Spencer | 364/807 |
| 4,786,612 | 11/1988 | Yau | 437/47 |
| 4,839,700 | 6/1989 | Ramesham et al. | 356/357 |
| 4,873,455 | 10/1989 | de Chambost | 307/201 |
| 4,875,183 | 10/1989 | Graf | 364/807 |
| 4,876,668 | 11/1989 | Thakoor | 365/163 |

(List continued on next page.)

FOREIGN PATENT DOCUMENTS 2-285668   11/1990   Japan .................................... 437/918

OTHER PUBLICATIONS

"DARPA Neural Network Study ", Armed Forces Communications & Electronics Association International Press, Nov. 1988, pp. 15–35.

R. P. Lippmann, "An Introduction to Computing with Neural Nets", IEEE ASSP Magazine, Apr. 1987.

L. D. Jackel, R. E. Howard, H. P. Graf, B. Straughn, and J. S. Denker, Artificial Neural Networks for Computing, J. Vac. Sci. Tech. B4(1), Jan/Feb 1986, pp. 61–63.

J. L. Lamb, A. P. Thakoor, A. Moopenn, and S. K. Khanna, "Resistive Synaptic Interconnects for Electronic Neural Networks", J. Vac. Sci. Tech. A5(4), Jul/Aug 1987, pp. 1407–1410.

C. Mead, *Analog VLSI and Neural System*, Addison Wesley, 1989.

B. McWilliams, C. Y. Fu, F. Mitlitsky, and K. Weiner, "Laser Processing: Novel Techniques for Integrated Circuits Fabrication and Repair", (Invited Paper), Conference on Laserw & Electro–Optics, Anaheim, CA, Apr. 1988.

C. Y. Fu, B. Law, N. Raley, V. Malba, R. Hsu, R. Hills and C. Lai "A Laser Direct Write Double–Level–Metal Technology for Rapid Fabrication", IEEE Custom Integrated Circuits Conference, Boston, MA, May 1990.

R. Hsu, C. Y. Fu, and Ben Law, "The Magnetron–Enhanced Etching of Double–Level–Tungsten Interconnect", The Electrochemical Society Symposium, Washington, D.C., May 1991.

C. Y. Fu, R. Hsu, and V. Malba, "Magnetron–Enchanced Reactive–Ion–Etching of Al–1%Si–2% Cu Alloy", Materials Research Society Symposium, Anaheim, Ca, Apr. 1991.

*Primary Examiner*—R. Bruce Breneman
*Assistant Examiner*—Linda J. Fleck
*Attorney, Agent, or Firm*—Henry P. Sartorio; Richard B. Main

[57] ABSTRACT

Customizable neural network in which one or more resistors form each synapse. All the resistors in the synaptic array are identical, thus simplifying the processing issues. Highly doped, amorphous silicon is used as the resistor material, to create extremely high resistances occupying very small spaces. Connected in series with each resistor in the array is at least one severable conductor whose uppermost layer has a lower reflectivity of laser energy than typical metal conductors at a desired laser wavelength.

8 Claims, 4 Drawing Sheets

U.S. PATENT DOCUMENTS

| | | | |
|---|---|---|---|
| 4,884,123 | 11/1989 | Dixit et al. | 437/192 |
| 4,903,226 | 2/1990 | Tsividis | 364/807 |
| 4,929,923 | 5/1990 | Dharmadhikari | 338/308 |
| 4,931,763 | 6/1990 | Ramesham | 338/22 SD |
| 4,937,475 | 6/1990 | Rhodes | 307/465 |
| 4,945,257 | 7/1990 | Marrocco, III | 307/201 |
| 4,961,002 | 10/1990 | Tam | 307/201 |
| 4,961,005 | 10/1990 | Salam | 307/201 |
| 4,962,342 | 10/1990 | Mead | 307/201 |
| 4,965,214 | 10/1990 | Choi | 437/24 |
| 4,969,021 | 11/1990 | Thakoor | 357/23.5 |
| 4,985,371 | 1/1991 | Rana et al. | 437/192 |
| 5,004,932 | 4/1991 | Nejime | 307/201 |
| 5,070,392 | 12/1991 | Coffey et al. | 437/192 |
| 5,141,597 | 8/1992 | Adams et al. | 437/918 |
| 5,151,376 | 9/1992 | Spinner, III | 437/918 |
| 5,159,661 | 10/1992 | Orshinsky et al. | 364/513 |
| 5,164,338 | 11/1992 | Graeger et al. | 437/918 |

PROCESS FOR FORMING SYNAPSES IN NEURAL NETWORKS AND RESISTOR THEREFOR

The United States Government has rights in this invention pursuant to Contract No. W-7405-ENG-48 between the U.S. Department of Energy and the University of California, for the operation of Lawrence Livermore National Laboratory.

BACKGROUND OF THE INVENTION

1. Field of the Invention

The invention relates to neural networks, and more particularly, to customizing the same both architecturally and in terms of synaptic weights, and to a technique for fabricating synaptic resistors usable in such a device.

2. Description of Related Art

In a typical neural network, a plurality of input neurons (which may simply be isolation buffers) receive input excitation signals. The outputs of the input neurons are coupled to selected ones of the inputs of a plurality of second level neurons via synaptic interconnection circuits or synapses. Different ones of the input signals combine with different weights at the inputs of the second level neurons, and the particular weight to be accorded each signal is governed by a setting in the synaptic interconnection circuit which couples that signal to that neuron. The outputs of the second level neurons may themselves further be coupled through another set of synaptic interconnection circuits, with selected weights, to inputs of selected ones of a plurality of third level neurons. In this case the second level neurons are often referred to as "hidden" neurons. The outputs of the third level neurons may be provided as the outputs of the overall network, in which case these neurons may be referred to as "output neurons", or they may be coupled to yet additional layers of neurons by additional selectively weighted synaptic interconnection circuits. In addition, in some neural network architectures, outputs of some of the neurons are fed back to the inputs of a prior level.

Neural networks may have a fixed interconnection pattern and fixed synaptic weights, or the synaptic weights may be made variable. If the synaptic weights are made variable, then the network may be given the capacity to "learn". For example, Tsividis U.S. Pat. No. 4,903,226 describes a network in which the neurons are all made up of operational amplifiers and the synaptic interconnection of circuits are merely MOS transistors whose series resistance is controlled by the charge on a capacitor connected to the gate. Currents from the outputs of several preselected neurons pass through their respective synaptic interconnection resistances and are combined at the input of the destination neuron; thus the resistance of each synaptic interconnection circuit defines the weight which an input signal is accorded at the input of the destination neuron. Once these resistance values are known for a particular application, a production version of the network may be mass produced using fixed resistors in place of the variable synaptic interconnection resistances.

One problem with variable resistance synaptic interconnection circuits is that they are generally highly complex and not suitable for integrating the huge number of synapses which are probably required to mimic an activity of the human brain with any degree of success. The human cerebral cortex, for example, contains approximately $10^{14}$ synapses, a factor which may well be responsible for the powerful cognitive capabilities exhibited by human beings.

Fixed resistor synaptic arrays may be a more promising approach toward such high densities, but each different application for a neural network requires its own set of synaptic interconnection weights. Most applications do not support the large production volumes which would be required to make such a neural network integrated circuit economical.

Accordingly, it is desirable to provide a customizable neural network chip which can be produced in large volume and subsequently be customized for a particular application. Such a device would be useful both for manufacturing production networks for low volume applications, and also for prototyping neural networks for applications which will eventually support the production volumes of a custom chip.

Tam U.S. Pat. No. 4,961,002 describes a synaptic array in which each synapse cell connecting an input and an output line is made using a dual-gate transistor. The transistor has a floating gate member for storing electrical charge, a pair of control gates coupled to a pair of input lines, and a drain coupled to an output summing line. The floating gate of the transistor is used for storing a charge which corresponds to the strength or weight of the neural connection. Thus, when a binary signal is applied to the cell from an input line, it is multiplied in an analog manner by the charge stored on the floating gate to determine the current to be coupled to the output summing line. The Tam device, therefore, essentially contains a synaptic interconnection circuit whose weight is programmable as an EEPROM cell.

In practice, however, the input-output relationship is not linear. It is therefore difficult to perform accurate computer simulations of how the chip would respond when various synaptic weights are programmed. Additionally, since the Tam device probably must be made using an 18-mask EEPROM process, it is likely that yields are low and the cost is high.

Other neural network chips have also been attempted using a transistor as the synaptic coupling element, biased to operate in the linear (subthreshold) region of its characteristic. These devices are difficult to manufacture and the useful signal range is small.

Ordinary integrated circuit resistors have been used to interconnect two points with a programmable resistance, although not in the context of a neural network so far as applicant is aware. For example, various forms of post-fabrication resistor trimming have been devised to adjust resistance values, including laser trimming or cutting, "Zener-zapping", and metal link cutting and blowing. Laser trimming involves the use of a laser to alter the shape of a resistor region and thereby bring its resistance to the desired value. Serious problems may arise from aging and annealing effects resulting from this technique, however. The "partially zapped" material along the edge of the cut trim path often has different properties from the undisturbed material, and its resistance may age at a different rate than the body of the resistor. This can give rise to a situation where a resistor which is initially trimmed to a particular ratio with other resistors on the chip, gradually drifts out of specification during usage.

To avoid aging problems, it is known to use a trimming geometry in which resistive links are either totally cut or left undisturbed. The infinite resistance of a cut resistor is unaffected by aging. Known techniques which make use of this property include a set of resistive links which are connected in a parallel geometry. However, if N-links are used, the resolution of the trim is only 1/N. Trim resolutions can be increased by using binary-weighted resistor links, but in such geometries, the ratios of resistance values have in the past been subject to undesirable variations due to process variations during fabrication and temperature variations during use. Additionally, it is undesirable to program resistances by laser cutting of the resistor material itself, since this limits the choice of resistor materials. As will be seen, choice of an optimum resistor material can greatly improve the packing density of a synaptic array.

Still another known approach for adjusting the resistance value of the resistors on integrated circuits is one in which the resistive links are shorted by metal. The metal shorts are blown open with a current pulse or a laser beam. Again, binary weighting offers advantages.

In Shier U.S. Pat. No. 4,782,320, incorporated herein by reference, there is described (outside the context of neural networks) a technique in which two terminal leads are coupled with a resistor network in which a plurality of N-sided meshes are each formed by N resistor elements linked at network nodes. Some of the resistor elements can be cut by a laser applied to the resistive film itself to thereby program a desired overall resistance value coupling the two terminal leads. In Shier's technique, however, the resistor itself is cut by the laser, thereby limiting the types of resistor materials that can be used.

With respect to integrated resistor technology, it is desirable that resistors used in a synaptic interconnection circuit be both as small as possible and have as high a resistivity as possible. Polycrystalline resistors used in conventional silicon processing have far too low a resistivity, and would therefore require extensive meandering over a large area to form a resistor having a high enough resistance. Polycrystalline silicon resistors are also very difficult to manufacture uniformly since the grain boundaries of the polycrystalline material, which play an important role in conductivity, are difficult to control in tile fabrication process.

Accordingly, it is an object of the present invention to provide a neural network integrated circuit chip which is configurable according to the interconnections and synaptic weights required by a large number of different applications. The neural network integrated circuit should also be able to support a very large number of synaptic interconnections with uniform and linear high resistance programmable weights, all with high yield.

SUMMARY OF THE INVENTION

According to the invention, a customizable neural network is provided in which one or more resistors form each synapse. All the resistors in the synaptic array are identical, thus simplifying the processing issues. Doped, amorphous silicon is used as the resistor material, to create extremely high resistances occupying very small spaces. Connected in series with each resistor in the array is at least one severable conductor whose uppermost layer has a lower reflectivity of laser energy than typical metal conductors at a desired laser wavelength.

The neural network integrated circuit chip may include a plurality of input isolation buffers for driving the input lines in the synaptic array, and a plurality of neuron circuits each coupled to receive as inputs several of the synaptic array output lines. The outputs of the neuron circuits may further be connected back to the input isolation buffers by severable links for feedback purposes. By severing appropriate ones of these feedback conductors, any of a large number of neural network architectures can be defined during the same laser cutting step in which the synaptic weights are programmed.

BRIEF DESCRIPTION OF THE DRAWINGS

The invention will be described with respect to particular embodiments thereof, and reference will be made to the drawings, in which.

DETAILED DESCRIPTION

Figure 1:
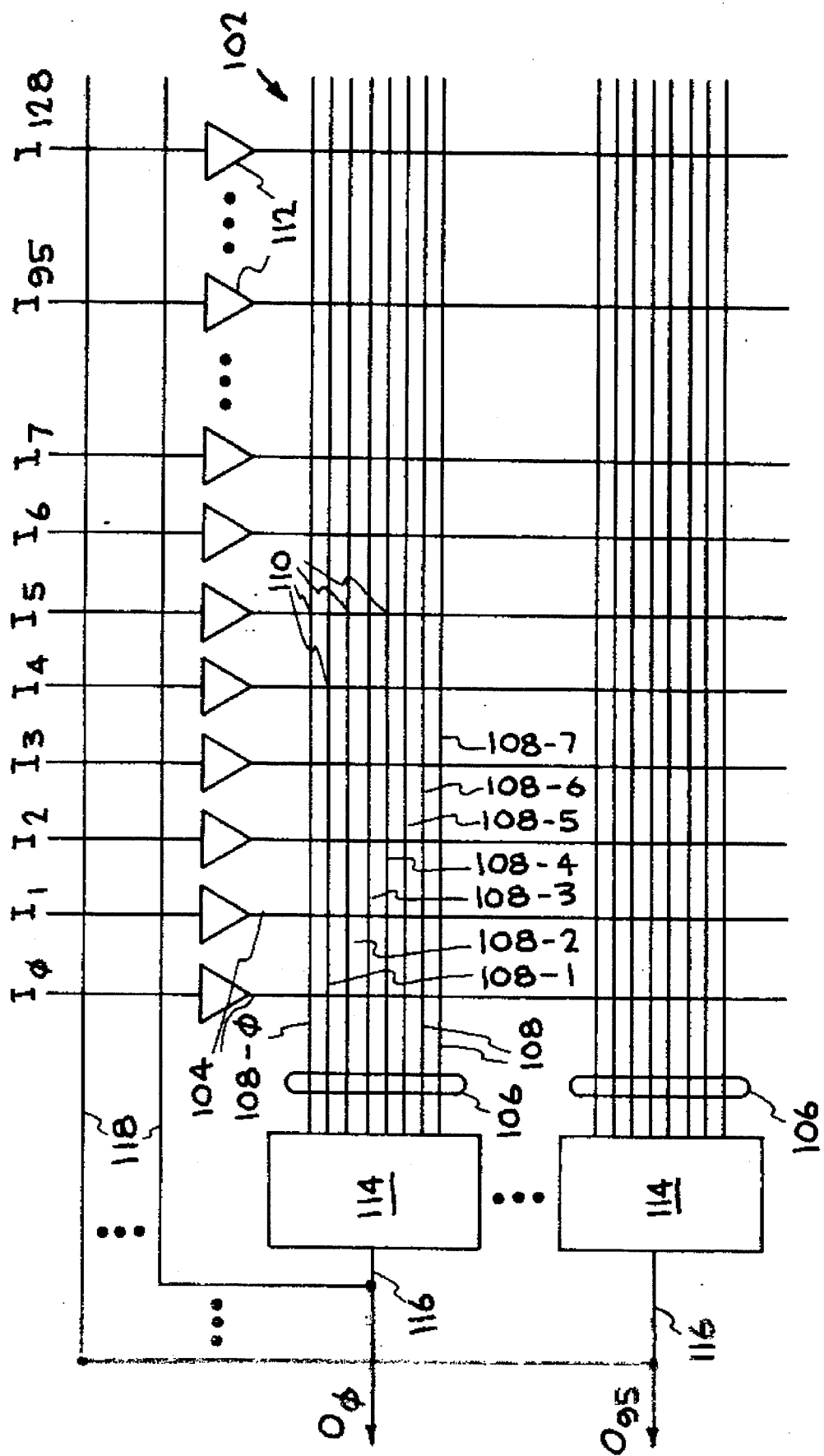
FIG. 1 is a symbolic diagram of a neural network integrated circuit which may incorporate the invention.

FIG. 1 is a symbolic diagram of a configurable neural network integrated circuit chip which may incorporate the invention. It comprises a synaptic array 102, comprising a plurality (for example 128) array input lines 104 oriented in parallel with each other. It also comprises a plurality (for example 96) of groups 106 of array output lines 108. Each group 106 may comprise, for example, eight output lines 108. The array output lines 108 are oriented in parallel with each other and perpendicularly to the array input lines 104. The crosspoints 110 themselves of the array input lines and the array output lines are insulated from each other by a dielectric, but near each crosspoint is a synaptic interconnection circuit as hereinafter described. Briefly, the synaptic interconnection circuits each include a single resistor series connected with a laser-severable bar, all of the resistors in the array being identical.

The array input lines 104 are each driven by the output of a respective input neuron 112, which may be a conventional buffer amplifier used for isolation purposes. Tho inputs to the buffers 112 are connected to respective pins (not shown) on the integrated circuit package. These pins are the signal input pins of the neural network of FIG. 1, and are designated $I_0, I_1, I_2, \ldots, I_{128}$.

The array output lines 108 in each given group 106 of array output lines are connected to respective inputs of a particular neuron 114 which corresponds to that group 106. The array output lines 108 in other groups 106 are connected to tho inputs of other neurons 114.

The neuron 114 is essentially an operational amplifier having eight inputs which are weighted according to a binary pattern. In particular, the current input on the $2^2$ input of the neuron 114 will be given half the weight as the current input on the $2^1$ input of the neuron 114, which in turn will be given half the weight of the current input on the $2^2$ input of the neuron 114, and so on. Accordingly, if the synapse coupling array input line 4, for example, to neuron 0, is to have a weight of 7, then the resisters coupling array input line 4 with the $2^0$, $2^1$ and $2^2$ inputs of neuron 0 should be intact, while the resisters coupling array input line 4 with the $2^3$–$2^7$ inputs of neuron 0 should be disconnected. Each array input line can be coupled to each neuron in this manner with any desired one of 255 available evenly stepped synaptic weights.

The outputs 116 of the neurons are connected to output pins (not-shown) of the chip, which are designated $O_0, O_1, O_2, \ldots, O_{95}$. These outputs are also connected back via severable architectural definition lines 118 to the input lines. They may be connected either to respective ones of the input lines such as $I_0$–$I_{95}$, or they may all be connected to all of the input lines.

The chip of FIG. 1 may be fabricated in two major steps. First, the buffers 112 and neurons 114 may be fabricated using conventional processing techniques with aluminum-based metal interconnects. Second, the synaptic array 102 and the severable architectural definition lines may be fabricated using different conductive material as hereinafter described.

The chip of FIG. 1 is mass produced with a fully connected synaptic array 102, and with all of the severable architectural definition lines 118 fully connected. In order to define the neural network architecture and the synaptic weights desired for a particular application, selected ones of the architectural definition lines 118 and selected ones of the severable bars in the array are severed using a laser. It is believed that because of the particular material with which the architectural definition lines 118 and severable bars are fabricated, the laser cut is clean, leaving no detectable metal traces or debris on the surface and inducing no detectable reaction of the metal with the underlying oxide.

Various neural network architectures can be defined using the chip of FIG. 1. For example, a single level structure can be implemented by severing all of the architectural definition lines 118. All of the inputs $l_0$–$l_{128}$ are therefore available as inputs to the synaptic array 102, and the outputs $O_0$–$O_{95}$ of the neurons 114 are taken as the outputs of the neural network. Alternatively, a three-level architecture can be defined by severing some, but not all, of the architectural definition lines 118. Thus, if the architectural definition lines 118 corresponding to outputs $O_{50}$–$O_{95}$, for example, are severed, then the neurons 114 corresponding to outputs $O_{50}$–$O_{95}$ can act as an output (third) level of neurons. The neurons 114 which provide outputs $O_0$–$O_{49}$ form a hidden (second) level of neurons, the outputs of which are fed to the inputs of the third level neurons via the intact architectural definition lines 118, the input buffers 112 corresponding to input lines $O_0$–$O_{49}$, and the synaptic array 102. The input buffers 112 corresponding to input lines $l_{50}$–$l_{128}$ form the input (first) level of neurons, providing signals to the second level neurons via the synaptic array 102.

Not only can multiple level architectures be defined using the integrated circuit of FIG. 1, but the circuit is also cascadable with other identical chips to multiply the number of available neurons. This can be accomplished simply by connecting the same input signal to the $I_1$ input of two or more of such chips, or alternatively, output buffers may be provided at the end of each array input line 104 opposite the input buffers 112 to further drive the input signals off chip to another chip.

Furthermore, though a subtractive process is illustrated in FIG. 1 for defining the architecture of a neural network, in particular by severing desired ones of the architectural definition lines 118, it will be understood that an additive technique can be used instead. As is well known, a laser can be used to "write" conductors on a wafer, for example by placing the wafer in a $WF_6$ environment and laser-heating the locations on the chip substrate on which a conductive line is to be formed. See, for example, McWilliams, Fu, Mitlitsky, and Weiner, "Laser Processing: Novel Techniques for Integrated Circuits Fabrication and Repair," (Invited Paper), Conference on Lasers and Electro-Optics, Anaheim, Calif., (1988), incorporated by reference herein. Such an additive process may be used to customize the chip architecture by adding desired ones of the architectural definition lines 118, as well as customize the synaptic connection weights by forming connections between only selected ones of the resistors and their corresponding array input or output lines 104, 108. An additive process may also be used to repair links which were severed erroneously in a subtractive process.

Figure 2:
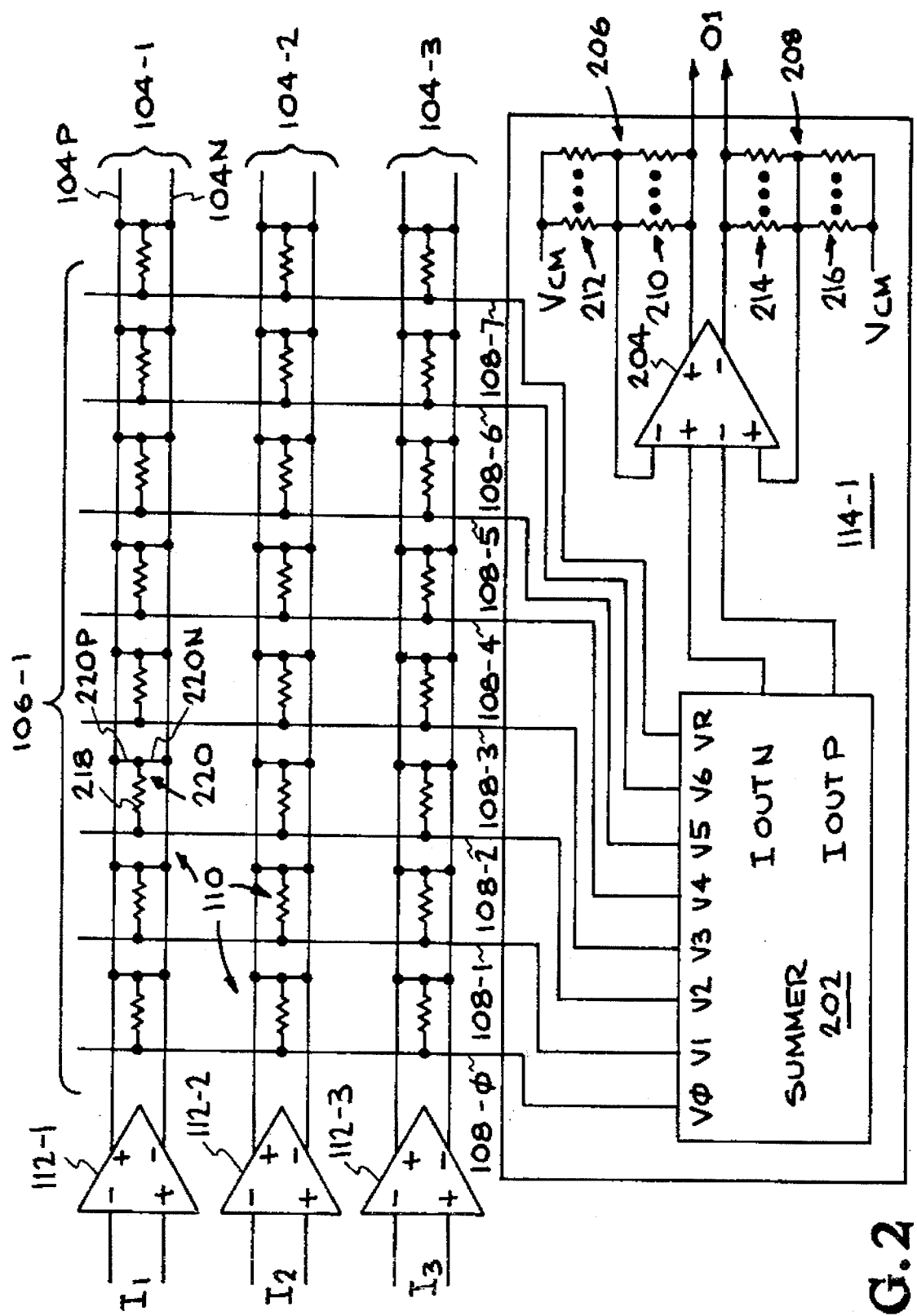
FIG. 2 is a schematic diagram of a portion of the network of FIG. 1.

FIG. 2 is a more detailed diagram of a portion of the network of FIG. 1. In particular, only three of the inputs are shown (11, 12 and 13) and one neuron output O1. The input buffers 112-1, 112-2 and 112-3 are differential input, differential output, unity gain operational amplifiers. If desired, one or more of these amplifiers may be converted to single input, differential output amplifiers by conventionally altering the feedback circuit around the amplifier.

Each of the neurons 114 contains a binary weighted summer section 202, the differential current output of which is connected to differential inputs of a sigmoid limited buffer amplifier 204. The amplifier 204 has a differential output which forms the output of the neuron 114, and which is fed back to differential inputs of the amplifier 204 via a pair of resistor dividers 206 and 208. The resistor divider 206 comprises a plurality of parallel-connected resistors 210 coupled between the positive differential output and the negative differential feedback input of the amplifier 204, and a similar plurality of parallel-connected resistors 212 coupled between the negative feedback input of buffer 204 and a common mode voltage Vcm. The resistor divider 208 comprises a plurality of parallel-connected resistors 214 coupled between the negative output of amplifier 204 and the positive feedback input, and a similar plurality of parallel-connected resistors coupled between the positive feedback input of amplifier 204 and Vcm. The resistors in the feedback networks 206 and 208 are all identical to all the other resistors in tile array, and include series-connected laser-severable bars. Thus the gain of the amplifier 204 can be programmed in the same laser cutting step in which the synaptic connection weights are defined and the neural network architecture is defined. Additionally, since the feedback resistors and the array resistors are all fabricated at the same time, their resistance will match closely, thereby improving temperature tracking performance. While a parallel-connected resistor feedback network is shown in FIG. 2, it will be understood that other types of networks may be used instead, including one which is binary weighted in the same manner as the eight inputs to the neuron 114.

All of the amplifiers 112 and 204 are differential about Vcm, which is a user-selectable common mode reference voltage. For minimum power dissipation and maximum linearity, Vcm may be 1.5 volts, and the sigmoid limits of amplifier 204 may be set at 0.5 volts and 2.5 volts. This gives the neuron amplifiers a dynamic range of plus or minus 1.0 volts. Although the resistors in the array are linear over a much greater range, the 2.0 volts output limit maximizes the linearity of the linear range of the amplifier and minimizes resistor power dissipation. The sigmoid limit voltages are common to all output amplifiers on the chip and are set by the user through external pins. The sigmoid limits can be disabled at any amplifier during laser cutting if linear processing is desired on some of the neurons.

The synaptic array 102 array input lines 104 preferably consist of respective differential pairs driven by respective input amplifiers 112. The array output lines 108 can be single-ended. Each of the synapses 110 is initially fabricated fully-connected, and later severed appropriately. A fully-connected synapse comprises a resistor 218 connected between one of the array output lines 108 and the middle of a respective severable bar 220. The severable bar 220 is connected across from one line of the differential array input pair 104 to the other. Thus the severable bar 220 has a portion 220P connected between a terminal of the resistor 218 and the positive line of a differential pair, and a second portion 220N connected between the terminal of the resistor 218 and the negative line of the differential pair. Each of the resistors 218 dissipates power dependent upon the voltage differential between its input and the average voltage of all the inputs which are coupled via the synaptic array to the same array output line 108.

The synaptic interconnection weight between one of the array input pairs 104 and one of the neurons 114 is defined by all eight resistors which are connected between tile pair 104 and the eight inputs 108 to the neuron 114. Any one of 255 evenly stepped synaptic weights can be programmed, ranging from −127 to +127. The high order input 108-7 to a neuron 114 defines the sign; if the portion 220N of the severable bar 220 for that resistor is left intact while, the portion 220P is severed, then the remaining resistor connections in the synapse define a positive weight. If the portion 220P is left intact and tile portion 220N is severed, then the remaining connections in the synapse define a negative weight. After the sign of the weight is defined in the high order resistor, then each of the other resistors in the synapse define a binary '0' if they are connected to the same line in the differential pair 104 as is the high order resistor, or a logic '1' if they are connected to the opposite line in the differential pair 104 as the high order resistor. The full range of synaptic weights can therefore be programmed by laser-severing selected portions 220N or 220P of the severable bars 220. It will be appreciated that other resolutions can be implemented using different numbers of binary inputs.

Figure 3:
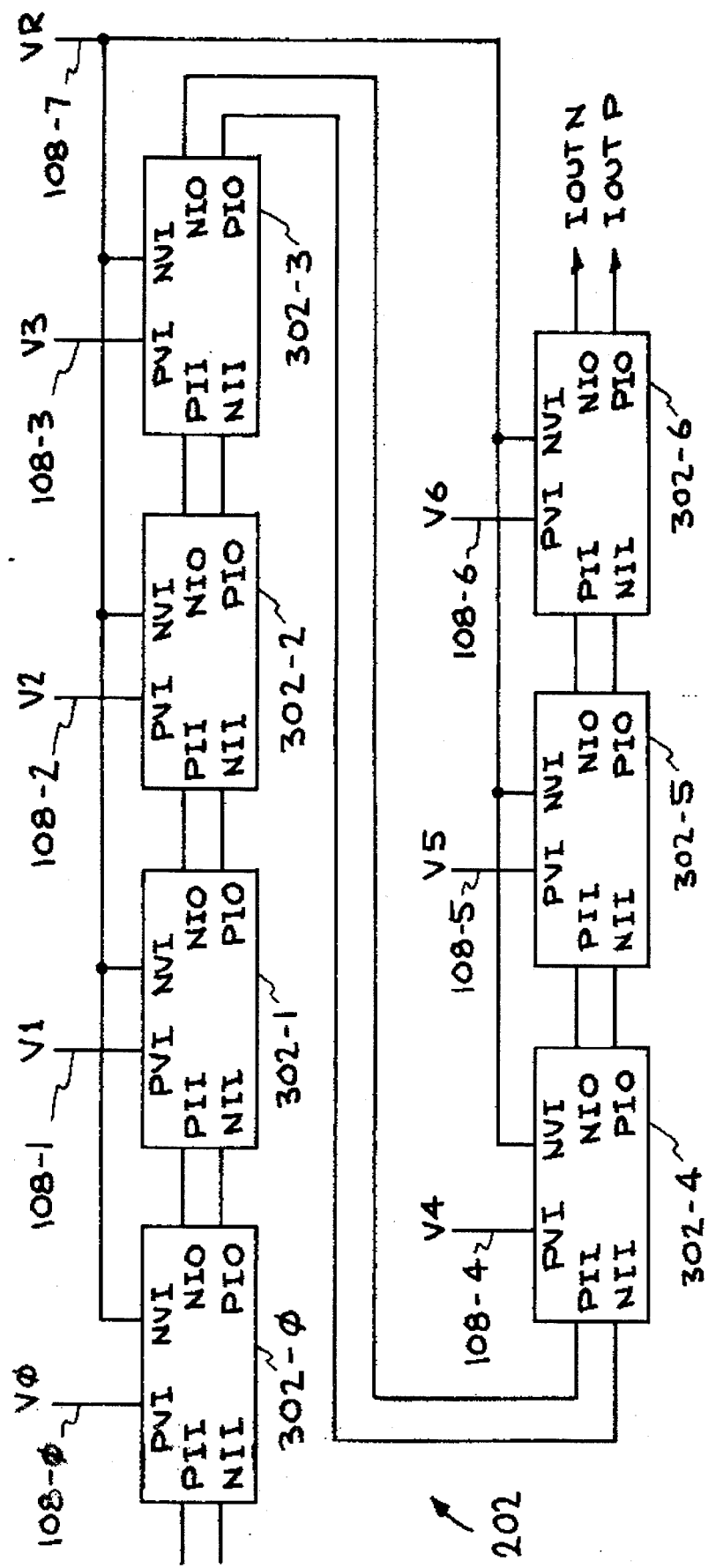
FIG. 3 is a block diagram of the summer in FIG. 2.

FIG. 3 is a detail of summer 202 (FIG. 2). It comprises seven essentially identical cells 302-0, 302-1 , . . . , 302-6. Each of the cells 302 has a positive and negative current input PII and NII, a positive and negative voltage input PVI and NVI, and a positive and negative current output PIO and NIO. The PIO and NIO outputs of each of the cells 302-0 through 302-5 are connected respectively to the NII and PII inputs of the immediately higher order cells 302-1 through 302-6. The PII and NII inputs of cell 302-0 are left unconnected, and the PIO and NIO outputs of cell 302-6 form the positive and negative output current signals IOUTP and IOUTN of the summer 202. The NVI inputs of each of the cells 302-0 through 302-6 are all connected to receive the high order input line 108-7 to the neuron 114. This input acts as a reference voltage VR inside the cells 302. The PVI input of each of the cells 302-i are connected to receive respective array output lines 108-i from the synaptic array 102. These signals are called V0, V1 , . . . , V6, respectively, in the summer 202. Each of the cells 302 can be thought of generating on its PIO and NIO outputs a current difference given by the formula, $$(PIO-NIO)=K(PVI-NVI)-\tfrac{1}{2}(PII-NII),$$

where K is a unity conversion factor from voltage to current. Since each of the cells 302 is made entirely of MOS transistors, this arrangement achieves binary weighting of the neuron 114 input signals 108-0 through 108-6 without requiring resistors anywhere on the integrated circuit chip having anything other than a single resistance value.

Each of the circuits 112, 202 and 204 are designed in resistorless CMOS. The input buffers 112, neuron output buffer 204 and each of the summer cells 302 are fully differential about the user-supplied Vcm. The maximum error of the summer 202 should not be greater than the resistor fabrication tolerances.

The technique used in the chip of FIG. 1, which determines different synaptic weights coupling an array input line 104 to a neuron 114 by the resistive connection between different ones of the binary weighted inputs to the neuron, and selectably the positive or negative line of the array input line 104 differential pair, permits the fabrication of the synaptic array 102 with a large number of resistors which are all identical, thereby simplifying the fabrication process, yet also providing a wide range of available synaptic weights for selection (e.g. 255 steps for an 8-input neuron). It will be appreciated, however, that other resistor arrangements can be used for the synaptic connection circuits. For example, neurons without binary weighted inputs may be used, together with synaptic interconnection circuits which are similar to any of the networks described in the abovementioned Shier patent. These schemes are not preferred since they may limit either the range or resolution of the synaptic weights which are selectable, or they may require the use of different resistors in the synaptic array 102 having different resistance values.

Figure 4A:
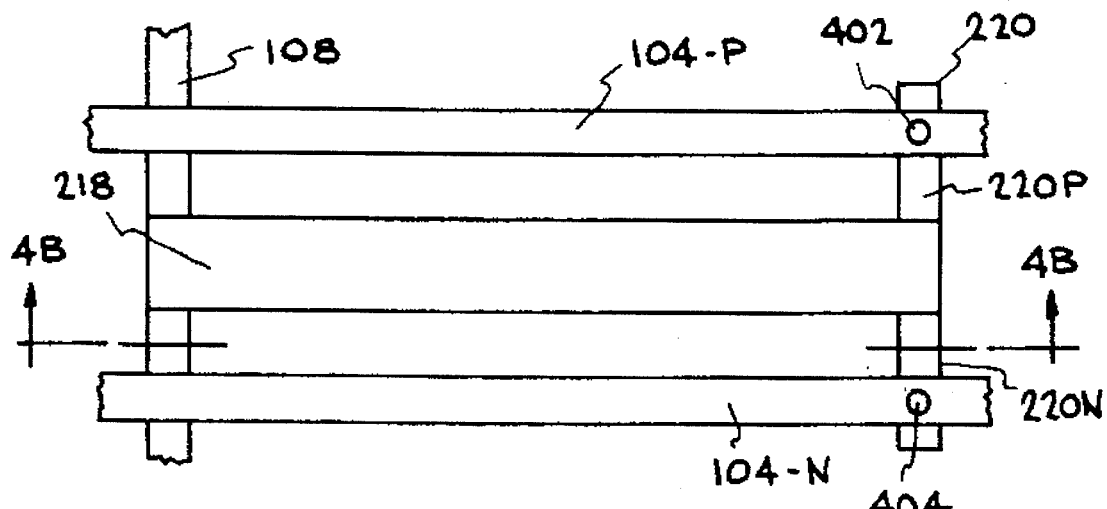
FIG. 4A is a plan view of part of a synaptic interconnection circuit in FIG. 2.

FIG. 4A is a plan view of one of the crosspoints 110 in the synaptic array 102 (FIG. 1), including the resistor 218 and the severable bar 220. As shown in FIG. 4A, both the, array output lines 108 and severable conductors 220 are formed in the metal 1 layer. The thin film resistor is shown as region 218, extending from an array input line 108 to the middle of a severable conductor 220 and perpendicular to both. There is no dielectric between the thin film resistor 218 and the metal 1 layer. The array input lines 104 (including both lines 104P and 104N of the differential pair) are formed in a metal 2 layer which is formed over an oxide covering the metal 1 layer. The metal 2 layer contacts both ends of the severable conductor 220 through respective vias 402 and 404.

Figure 4B:
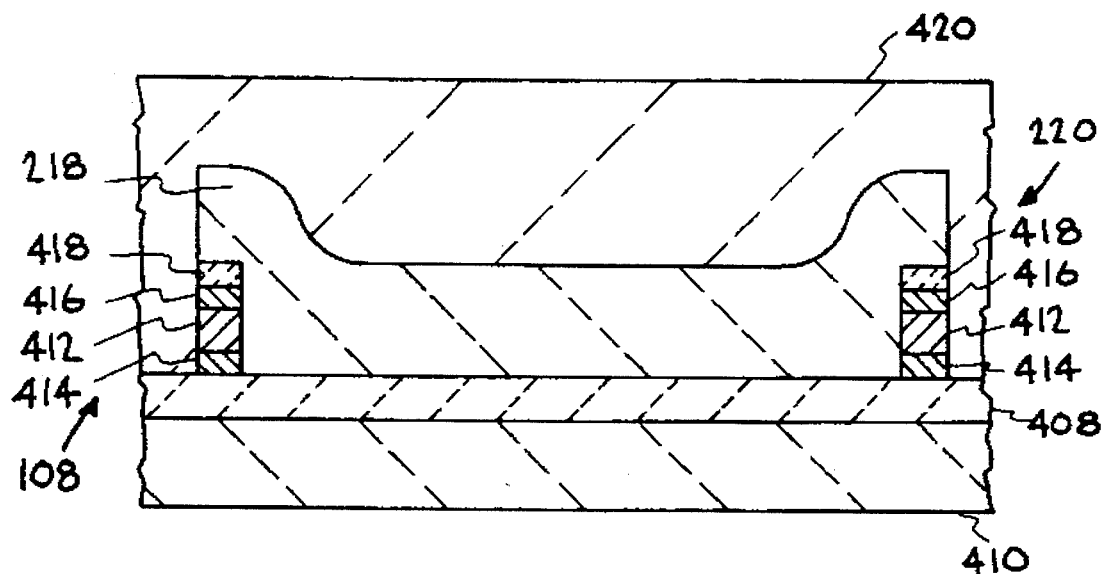
FIG. 4B is a cross-sectional view the structure of FIG. 4A, taken along lines B—B.

FIG. 4B is a cross-sectional view of an array output line 108, a severable conductor 220 and the resistor 218, taken along line B—B of FIG. 3. As can be seen, metal 1 is formed over an oxide layer 408 which is itself grown over the silicon substrate 410. The metal 1 layer is primarily a tungsten layer 412. A thin layer 414 of titanium tungsten is formed at the interface between layer 412 and the oxide 408. Another layer 416 of titanium tungsten is formed over the tungsten 412, and a thin layer 418 of amorphous silicon is formed over the layer 416. It is believed that during an annealing step described below, titanium silicide is formed at the interface between layers 416 and 418, and may extend mostly through the layer 418.

Tungsten is chosen as the refractory material mainly because of its mechanical strength, its resistance to electric migration, and its compatibility with conventional silicon processing. Other refractory metals such as molybdenum may also suffice. In addition, it has been discovered that this tungsten-based metal layer severs unusually cleanly upon the application of a laser beam. The relatively high resistivity of tungsten as compared to more conventional aluminum is not a problem in the synaptic array 102 since the total resistance which it adds in different length signal paths through the synaptic array 102 is still negligible compared to the extremely large resistance of the doped amorphous silicon thin film 218.

The resistor material 218 is amorphous silicon doped with boron. Amorphous silicon is desirable as a resistor because it is radiation-hard and because it provides wide flexibility in the choice of resistor values. Other resistor materials may be used instead of amorphous silicon, but they should be amorphous or at most, microcrystalline. If a microcrystalline material is used, in order to maintain uniformity across different resistors on a chip, the material should be such that normal process variations will not significantly affect either the quantity of grain boundaries or their structure.

The resistor material 218 is formed directly over the metal 1 layer without any dielectric between the two layers. The more common method of forming a dielectric layer over metal 1, opening vias in the dielectric, and depositing resistor material over the dielectric, may be used instead. The latter method is not preferred, however, since the resulting topological variations in the resistive film could adversely affect uniformity.

Another technique is described in Jackel, et al., "Artificial Neural Networks For Computing", J. Vac. Sci. Technol. Vol. B4(1), pp. 61–63 (1986), at p. 63, wherein synapses in a neural network array are formed by etching holes in a dielectric with the resist subsequently used again as a liftoff stencil for filling the hole in the dielectric with e-beam evaporated amorphous silicon. The Jackel method is also not preferred, since the possible shadowing effects on the resistive film could adversely effect uniformity, especially for the case of wafer scale integration.

Ramesham U.S. Pat. No. 4,931,763 appears to describe a thin film element formed directly (without a dielectric) over a prior metal layer, but this thin film is not highly doped amorphous silicon. See also, Thakoor U.S. Pat. No. 4,876,668 and Lamb, "Resistive Synaptic Interconnects For Electronic Neural Networks", Journal of the Vac. Sci. Technol. Vol. A5(4), pp. 1407–1411 (1987).

The individual processing steps for fabricating the synaptic array 102 will now be described. First, the insulating oxide layer 408 is grown on the silicon substrate 410 by conventional techniques. The wafer is then placed in a vacuum chamber, and the metal 1 layer is formed by conventional sputtering techniques. In particular, a thin layer of titanium tungsten 414 is deposited to a thickness of approximately 300 angstroms. The titanium tungsten helps the tungsten layer 412 adhere with the oxide layer 408. Other materials such as titanium or chromium may be used instead of titanium tungsten. Also, no such layer may be required if metal 1 is made of another material (such as aluminum) which adheres better to silicon dioxide than tungsten does.

The tungsten layer 412 is then applied to a thickness of approximately 1100 angstroms. Another layer 416 of titanium tungsten is then deposited to a thickness of approximately 600 angstroms, and without breaking vacuum, a layer 418 of amorphous silicon is then deposited to a thickness of approximately 350 angstroms. The titanium tungsten layer 416 is included in order to react better than pure tungsten would with the silicon layer 418, in order to form a layer of titanium silicide in an annealing step described below. The; amorphous silicon layer 418 is preferably highly doped with a dopant such as boron. The silicide layer and the doping in the amorphous silicon layer 418 are both desireable to improve the electrical contact between the resistor 218 and the metal 1 layer. Excellent electrical contact is not essential, however, since the resistance of the resistor 218 is so high that the actual resistivity of the contact is negligible. The amorphous silicon layer 418 is applied in the same vacuum chamber as the titanium tungsten layer 416 in order to prevent the formation of titanium oxide between these two layers since titanium is highly reactive in air, thus improving the chances of achieving good electrical contact.

After the four levels of the metal 1 layer have been applied, the wafer is removed from the vacuum chamber and patterned using conventional techniques to define the array output lines 108 and the severable bars 220. The entire wafer is then encapsulated with a highly doped amorphous silicon capping layer to a depth of approximately 600 angstroms using PECVD. Boron is again the preferred dopant. Again, high doping levels in this step are preferred in order to improve the electrical connection between the resistor 218 and the conductors of the metal 1 layer.

The capping layer protects the uncovered edges of the titanium tungsten layers 414 and 416 from oxidation during an annealing step described below. Other materials may be used instead of amorphous silicon, but it is useful to use the same material as the top layer 418 of metal 1 in order to assist in dopant migration.

After the capping layer is applied, the wafer is annealed in a furnace at approximately 425° C. A temperature of 425° C. is chosen since it is a high temperature which is comfortably below the temperature (approximately 450° C.) which could degrade the aluminum metal lines which are used for conduction in the buffers 112 and neurons 114. This temperature also is significantly below the crystallization temperature of silicon (580°–620° C.). In addition to possibly forming the titanium silicide interface between layers 416 and 418, it is also believed that the annealing step induces the migration of dopant atoms from the capping layer into the top level 418 of amorphous silicon on the metal 1 layer to further improve contact with the resistor.

After the annealing step, the wafer is again etched to remove all 600 angstroms of the capping layer of amorphous silicon. Depending on exactly how much amorphous silicon is etched, and depending on how much of the amorphous silicon level 418 was consumed with the formation of silicide at the interface between levels 418 and 416, the top surface of the metal 1 layer may now be either amorphous silicon or titanium silicide. Additionally, an amorphous silicon spacer remains on the edges of the metal 1 layer after removal of the capping layer to further improve electrical contact with the resistor.

The resistor layer is deposited next by conventional plasma enhanced chemical vapor deposition (PECVD). In particular, doped amorphous silicon is deposited to a depth of approximately 2000 angstroms. The dopant is again preferably boron, although other dopants such as phosphorous are also usable (although the dopant used elsewhere herein should then also be a p-type material). Although the exact method of electrical conduction through the film is not entirely understood, it is believed that the doping level should be high enough to achieve the desired resistivity. A higher doping level also permits a lower annealing temperature in a second annealing step described below. The doping level should not be so high, however, that an excessive number of boron atoms are included which do not participate in the conduction since it is believed that unnecessarily high levels of boron can risk moisture absorption should the boron form boron oxide, and thus possible unreliability of the resistor structure may result.

After the resistor material has been deposited, it is patterned by conventional techniques to define the resistors 218. An oxide layer is then formed over the entire wafer and the wafer is again annealed to produce the desired resistivity. The annealing temperature is preferably between 350° C. and 450° C. with an annealing time of approximately 1 hour. Lower temperatures are preferred since they result in a higher resistivity and are less likely to damage aluminum metal lines in the buffers 112 and neurons 114. However, temperatures at the higher end of the range may be required to obtain a desired resistivity in spite of lower dopant levels in the amorphous silicon resistor material. It should be noted that although 450° C. is well below the crystallization temperature of silicon (580° C.–620° C.), this annealing step may actually produce microcrystalline silicon.

After the resistors are annealed, vias 402 and 404 are opened in the oxide to expose the two ends of the severable bars 220, and the metal 2 layer is then formed and patterned to define the array input lines 104. The metal 2 layer may be single or multiple levels (titanium tungsten, tungsten), but no top surface of amorphous silicon is required.

The wafer is then encapsulated with a top protective layer 408 of oxide and holes may be etched to expose a portion of each of the severable bars 220 for laser cutting. Specifically, a hole is etched over each portion 220P and 220N of each of the bars 220. These holes are not actually required since the laser can be used to cut a hole through the oxide and to sever a metal bar 220P or 220N in a single step.

Resistors 218 fabricated in the above manner have been found to have a very high resistivity, on the order of 4 megohms per square. Such resistors are extremely compact and do not require meandering to achieve such high resistance values. A 4 megohm resistor can be formed, for example, in a 10 micron×10 micron square. Such resistors are also highly linear (with a linearity of less than 0.1%) and highly uniform (with a standard deviation in resistance less than 0.8%). The resistors may be fabricated in smaller sizes such as 3 micron by 3 micron with some loss of uniformity due to non-uniform under-cutting by etchant.

As previously mentioned, configuration of the synaptic array for the desired synaptic weights is accomplished by laser cutting of desired portions 220P or 220N of each of the severable metal bars 220. Since the bars instead of the resistors themselves are cut, the laser cutting process imposes no restrictions on the material used to form the resistors.

In the past, laser cutting was often performed on silicon or polysilicon lines in an environment of chlorine gas. When the laser was applied, the exposed portion of the silicon combined with chlorine molecules and evaporated. This process is undesirable since it involves the use of toxic materials.

Abrasive techniques for cutting conductive material are also known, in which the wafer is placed in a vacuum and large amounts of energy are applied to the portion to be cut. Abrasive techniques, however, typically produce large amounts of debris which degrade reliability and could impair the functioning of the remainder of the circuitry.

Applicant has discovered that a laser can be used to cut the material of the metal 1 layer described above in a vacuum without producing detectable amounts of debris. While the reason for such clean cutting is not fully understood, it is believed that the particular material (tungsten) of the metal layer and the material of the top surface of the metal 1 layer contribute. In particular, as previously mentioned, the top surface of the metal 1 layer after the first annealing step and removal of the capping layer is either amorphous silicon or titanium silicide depending on exactly how much material was etched when removing the capping layer and on how much of the amorphous silicon level 418 was consumed to form titanium silicide during the first annealing step. In either case, whereas tungsten itself is highly reflective of laser light in the desired wavelength (514 nanometers), both amorphous silicon and titanium silicide are far less reflective. Energy from the laser is therefore coupled into the severable bar 220 much more efficiently than would be the case with a pure tungsten bar.

Accordingly, in order to program the synaptic array 102 and to sever desired ones of the architectural definition lines 118, the wafer is placed on a mechanical stage and a 514 nanometer water cooled argon laser is applied. The laser beam is positioned within a scanning window by applying RF modulation on the two accusto-optic scanner crystals to separately control the horizontal and vertical scans. After the window is scanned, the stage moves to a new position for the patterning of another window in a conventional manner. It will be appreciated that other schemes are available for coupling energy into the desired points of the metal 1 layer, such as with ion beams or electron beams. Also, it will be appreciated that both the laser cutting technique described herein and the resistor material described herein may be used with other substrates besides silicon, such as GaAs or SOI. It will also be appreciated that both the resistor material and the laser cutting technique described herein are useable in many contexts outside that of neural networks, such as compact SRAM designs.

The invention has been described with respect to particular embodiments thereof, and it will be understood that numerous modifications may be made without departing from the scope of the invention.

I claim:

1. A method of making an integrated circuit structure, comprising the steps of:

depositing a layer of tungsten (412);

depositing a layer of titanium tungsten (416) over said layer of said tungsten;

without breaking vacuum after said step of depositing a layer of titanium tungsten, depositing a first layer of amorphous silicon (418) over said layer of titanium tungsten;

patterning said layers together to define a conductor (108, 220);

encapsulating said conductor in a capping layer;

annealing said encapsulated conductor at temperatures below the crystallization temperature of said first layer of amorphous silicon; and removing said capping layer.

2. A method according to claim 1, wherein said capping layer consists essentially of doped amorphous silicon, said first amorphous silicon layer also being doped, said method further comprising, after said step of removing, the steps of:

depositing a third layer of doped amorphous silicon (218), no step of depositing a dielectric taking place between said step of depositing a layer of tungsten and said step of depositing a third layer of doped amorphous silicon;

patterning said third layer of doped amorphous silicon to define a resistor contacting said conductor; and annealing said third layer of doped amorphous silicon for a desired time period and at annealing temperatures below the crystallization temperature of said third layer of doped amorphous silicon.

3. A method according to claim 1, further comprising, after said step of removing, the step of exposing said conductor to laser energy to sever said conductor (220N or 220P).

4. Method for fabricating a laser-programmable integrated circuit device, comprising the steps of:

fabricating a plurality of pairs of conductor lines (104P and 104N) to extend from a corresponding plurality of differential-output buffers (112) into an array (102);

fabricating a group (106) of array output lines (108) to cross over individual said pairs of conductor lines (104P and 104N) in said array (102);

fabricating a plurality of two each individual connective links (220P and 220N) in series to connect across each of said pairs of conductor lines (104P and 104N) at points corresponding to said cross-overs of said array output lines (108); and fabricating a plurality of equal value resistors (218) wherein individual said resistors are located at said crossing over points and each connects an individual array output line (108) to an individual junction between said two connective links (220P and 220N).

5. The method of claim 4, further comprising the step of:

laser cutting one of said two each individual connective links (220P and 220N) at said crossing over points wherein a corresponding resistor (218) is connected between said individual array output line (108) and no more than one individual of said pair of conductor lines (104P and 104N).

6. The method of claim 4, wherein the step of fabricating a plurality of two each individual connective links (220P and 220N) in series comprises:

depositing an oxide (408) on a substrate (410);

depositing a titanium-tungsten adhesion layer (414) on said oxide (408);

depositing a tungsten metal layer (412) to be adhered to the oxide (408) with the adhesion layer (414);

depositing a titanium tungsten cap (416) on said tungsten metal layer (412); and depositing a top layer of amorphous silicon (418) on said titanium tungsten cap (416) and providing for the formation of titanium silicide from a reaction of said titanium tungsten cap (416) and said top layer of amorphous silicon (418) during a subsequent step of annealing.

7. The method of claim 4, wherein the step of fabricating a plurality of pairs of conductor lines (104P and 104N) comprises:

depositing an oxide (408) on a substrate (410);

depositing a titanium-tungsten adhesion layer (414) on said oxide (408);

depositing a tungsten metal layer (412) to be adhered to the oxide (408) with the adhesion layer (414);

depositing a titanium tungsten cap (416) on said tungsten metal layer (412); and depositing a top layer of amorphous silicon (418) on said titanium tungsten cap (416) and providing for the formation of titanium silicide from a reaction of said titanium tungsten cap (416) and said top layer of amorphous silicon (418) during a subsequent step of annealing.

8. The method of claim 4, wherein the step of fabricating a plurality of equal value resistors (218) comprises:

depositing amorphous silicon doped with boron over a junction of each of said plurality of two each individual connective links (220P and 220N) in series.

* * * * *